(12) United States Patent
Yang et al.

(10) Patent No.: US 11,380,818 B2
(45) Date of Patent: Jul. 5, 2022

(54) SEMICONDUCTOR LIGHT EMITTING DEVICE

(71) Applicant: SAMSUNG ELECTRONICS CO., LTD., Suwon-si (KR)

(72) Inventors: Jongin Yang, Hwaseong-si (KR); Hankyu Seong, Seoul (KR); Sunghyun Sim, Uiwang-si (KR); Jihye Yeon, Suwon-si (KR); Hanul Yoo, Bucheon-si (KR); Jihoon Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 15/932,000

(22) Filed: May 14, 2020

(65) Prior Publication Data

US 2021/0167248 A1 Jun. 3, 2021

(30) Foreign Application Priority Data

Dec. 3, 2019 (KR) .................. 10-2019-0158788

(51) Int. Cl.
*H01L 33/24* (2010.01)
*H01L 33/50* (2010.01)
*H01L 33/38* (2010.01)
*H01L 33/44* (2010.01)
*H01L 33/62* (2010.01)
(Continued)

(52) U.S. Cl.
CPC ............ *H01L 33/24* (2013.01); *H01L 27/156* (2013.01); *H01L 33/385* (2013.01); *H01L 33/44* (2013.01); *H01L 33/502* (2013.01); *H01L 33/505* (2013.01); *H01L 33/62* (2013.01); *H01L 33/0075* (2013.01); *H01L 2933/0016* (2013.01); *H01L 2933/0025* (2013.01); *H01L 2933/0066* (2013.01)

(58) Field of Classification Search
CPC ....... H01L 33/24; H01L 33/385; H01L 33/44; H01L 33/502; H01L 33/505; H01L 33/62; H01L 33/0075; H01L 27/156; H01L 2933/0016; H01L 2933/0025; H01L 2933/0066

See application file for complete search history.

(56) References Cited

U.S. PATENT DOCUMENTS 8,884,318 B2 11/2014 Lee et al.
9,093,627 B2 7/2015 Lee et al.
9,287,462 B2 3/2016 Lee et al.
(Continued)

FOREIGN PATENT DOCUMENTS

KR 10-0966372 B1 6/2010
KR 10-2014-0117791 A 10/2014
KR 10-1873259 B1 7/2018

*Primary Examiner* — Mark W Tornow
(74) *Attorney, Agent, or Firm* — Lee IP Law, P.C.

(57) ABSTRACT

A semiconductor light emitting device including at least one light emitting structure on a substrate, the at least one light emitting structure including a first semiconductor pattern, an active pattern, and a second semiconductor pattern sequentially stacked in a vertical direction substantially perpendicular to an upper surface of the substrate; a first electrode contacting a substrate-facing surface of the first semiconductor pattern; and a second electrode at least partially surrounding and contacting a sidewall of the second semiconductor pattern.

17 Claims, 17 Drawing Sheets

(51) Int. Cl.
    *H01L 27/15*     (2006.01)
    *H01L 33/00*     (2010.01)

(56) References Cited

U.S. PATENT DOCUMENTS

| | | |
|---|---|---|
| 9,293,664 B2 | 3/2016 | Seo et al. |
| 9,356,212 B2 | 5/2016 | Oh et al. |
| 9,373,746 B2 | 6/2016 | Hwang et al. |
| 9,379,282 B1 | 6/2016 | Lee et al. |
| 9,634,061 B2 | 4/2017 | Lee et al. |
| 9,640,583 B2 | 5/2017 | Choi et al. |
| 9,735,329 B2 | 8/2017 | Oh et al. |
| 9,768,345 B2 | 9/2017 | Hu et al. |
| 10,256,387 B2 | 4/2019 | Oh et al. |
| 10,879,217 B1 * | 12/2020 | Li ................ H01L 33/387 |
| 2012/0326118 A1 * | 12/2012 | Nitta ............. H01L 33/385 |
| | | 257/13 |
| 2017/0069609 A1 * | 3/2017 | Zhang ............ H01L 25/167 |
| 2019/0267357 A1 * | 8/2019 | Iguchi ........... H01L 25/0753 |
| 2019/0273179 A1 * | 9/2019 | Iguchi ........... H01L 33/0075 |
| 2020/0075805 A1 * | 3/2020 | Lai ............... H01L 25/0753 |
| 2020/0152693 A1 * | 5/2020 | Zou .............. H01L 27/153 |

* cited by examiner

US 11,380,818 B2

SEMICONDUCTOR LIGHT EMITTING DEVICE

CROSS-REFERENCE TO RELATED APPLICATION

Korean Patent Application No. 10-2019-0158788, filed on Dec. 3, 2019, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

When a semiconductor light emitting device is manufactured, a second semiconductor layer, an active layer, and a first semiconductor layer may be sequentially formed on a base substrate, and may be partially etched by a MESA process to form a light emitting structure including a second semiconductor pattern, an active pattern, and a first semiconductor pattern. The second semiconductor pattern may be formed by partially etching an upper portion of the second semiconductor layer, and an upper surface of the second semiconductor pattern may be exposed. A first electrode and a second electrode may be formed on the exposed semiconductor pattern and an upper surface of the first semiconductor pattern, respectively.

SUMMARY

The embodiments may be realized by providing a semiconductor light emitting device including at least one light emitting structure on a substrate, the at least one light emitting structure including a first semiconductor pattern, an active pattern, and a second semiconductor pattern sequentially stacked in a vertical direction substantially perpendicular to an upper surface of the substrate; a first electrode contacting a substrate-facing surface of the first semiconductor pattern; and a second electrode at least partially surrounding and contacting a sidewall of the second semiconductor pattern.

The embodiments may be realized by providing a semiconductor light emitting device including light emitting structures spaced apart from each other on a substrate, each of the light emitting structures including a first semiconductor pattern, an active pattern, and a second semiconductor pattern sequentially stacked in a vertical direction substantially perpendicular to an upper surface of the substrate; first electrodes contacting a substrate-facing surface of the first semiconductor pattern of each of the light emitting structures; and second electrodes at least partially surrounding and contacting a sidewall of the second semiconductor pattern of each of the light emitting structures, wherein the second electrodes extend in a horizontal direction substantially parallel to the upper surface of the substrate to be connected with each other.

The embodiments may be realized by providing a semiconductor light emitting device including light emitting structures spaced apart from each other on a drive IC substrate, each of the light emitting structures including a first semiconductor pattern, an active pattern, and a second semiconductor pattern sequentially stacked in a vertical direction substantially perpendicular to an upper surface of the drive IC substrate; first electrodes respectively a contacting drive IC substrate-facing surface of the first semiconductor pattern of each of the light emitting structures; second electrodes respectively surrounding and contacting a sidewall of the second semiconductor pattern of each of the light emitting structures; first contact plugs on the drive IC substrate, each first contact plug contacting a corresponding one of the first electrodes; second contact plugs on the drive IC substrate, each second contact plug contacting a corresponding one of the second electrodes; photo-conversion patterns on respective second semiconductor patterns of the light emitting structures; and a conductive division pattern surrounding the photo-conversion patterns, the conductive division pattern being electrically connected to the second electrodes, wherein the second electrodes extend in a horizontal direction substantially parallel to the upper surface of the substrate to be connected with each other.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
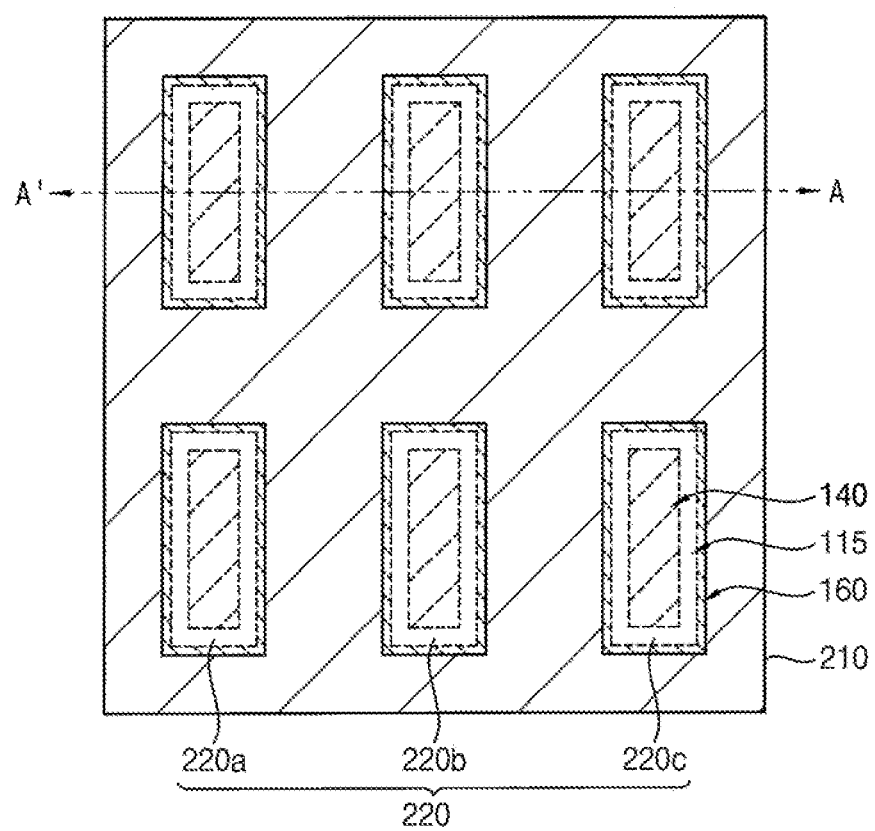
FIGS. 1 and 2A are a plan view and a cross-sectional view, respectively, of a semiconductor light emitting device in accordance with example embodiments.
Figure 2A:
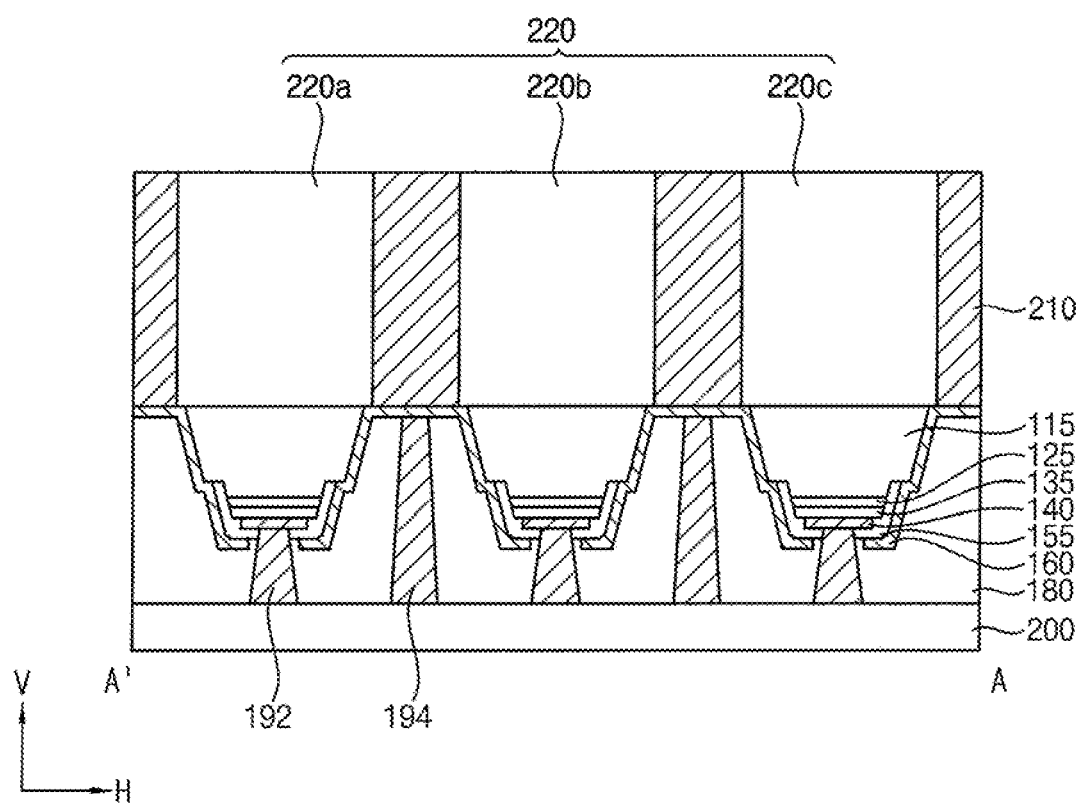

FIGS. 1 and 2A are a plan view and a cross-sectional view, respectively, of a semiconductor light emitting device in accordance with example embodiments. FIG. 1 is a plan view, and FIG. 2A is a cross-sectional view taken along a line A-A' of FIG. 1.

Referring to FIGS. 1 and 2A, the semiconductor light emitting device may include, e.g., an insulation pattern 155, a first electrode 140, a light emitting structure, and a second electrode 160 (e.g., sequentially stacked) on a substrate 200. The second electrode 160 may surround and contact (e.g., directly contact) a sidewall of the light emitting structure. The light emitting structure may include, e.g., a first semiconductor pattern 135, an active pattern 125, and a second semiconductor pattern 115 (e.g., sequentially stacked). The semiconductor light emitting device may further include a first contact plug 192 and a second contact plug 194 respectively contacting and being electrically connected to the first electrode 140 and the second electrode 160, a conductive division pattern 210 contacting and being electrically connected to an upper surface of the second electrode 160, and a photo-conversion pattern 220 on an upper surface (e.g., surface facing away from the substrate 200 in a vertical direction V) of the second semiconductor pattern 115 and a portion of an upper surface of the second electrode 160.

A driver integrated circuit (IC) may be buried in the substrate 200 to be electrically connected to the first contact plug 192 and the second contact plug 194.

In an implementation, a plurality of light emitting structures may be spaced apart from each other in a horizontal direction H substantially parallel to an upper surface (e.g., surface facing in the vertical direction V) of the substrate 200, and each of the light emitting structures may have a shape of, e.g., a circle or a polygon such as a rectangle in a plan view.

The first semiconductor pattern 135 and the active pattern 125 in the light emitting structure may have a constant or uniform thickness (e.g., as measured in the vertical direction V), and the second semiconductor pattern 115 may have a thickness greater than those of the first semiconductor pattern 135 and the active pattern 125. The first semiconductor pattern 135, the active pattern 125, and the second semiconductor pattern 115 (e.g., sequentially stacked) may have a width (e.g., as measured in the horizontal direction H) that (e.g., gradually and/or discontinuously) decreases from a top (e.g., a position distal to the substrate 200 in the vertical direction V) toward a bottom (e.g., a position proximate to the substrate 200 in the vertical direction V) thereof. For example, the light emitting structure may have a tapered shape that becomes narrower with proximity to the substrate 200 in the vertical direction V.

The first semiconductor pattern 135 may include gallium nitride (GaN) doped with magnesium, aluminum gallium nitride (AlGaN), indium gallium nitride (InGaN), or the like, and may have a p-type conductivity. As used herein, the term "or" is not an exclusive term, e.g., "A or B" would include A, B, or A and B.

The active pattern 125 may include indium gallium nitride (InGaN), and may have a quantum well (QW) structure.

The second semiconductor pattern 115 may include gallium nitride (GaN) doped with silicon (Si), germanium (Ge), selenium (Se), tellurium (Te), or carbon (C), and may have an n-type conductivity.

In an implementation, a plurality of the first electrodes 140 may be spaced apart from each other in the horizontal direction H, and may have a shape of, e.g., a circle or a polygon such as a rectangle in a plan view. The first electrode 140 may have an area smaller than that of the light emitting structure in a plan view.

The insulation pattern 155 may include an insulating material, e.g., silicon oxide, silicon nitride, or the like, and may cover a portion of a lower surface (e.g., substrate 200-facing surface) and a sidewall of the first electrode 140, a portion of a lower surface and a sidewall of the first semiconductor pattern 135, a sidewall of the active pattern 125, and a lower sidewall of the second semiconductor pattern 115 (e.g., a sidewall of a portion of the second semiconductor pattern 115 that is proximate to the substrate 200 in the vertical direction V).

The second electrode 160 may cover and surround an upper sidewall of the second semiconductor pattern 115 (e.g., a sidewall of a portion of the second semiconductor pattern 115 that is distal to the substrate 200 in the vertical direction V), and a sidewall and a portion of a lower surface (e.g., substrate 200-facing surface) of the insulation pattern 155. The second electrode 160 may extend in the horizontal direction H to be commonly connected to the second semiconductor patterns 115 of the (e.g., adjacent) light emitting structures, and may serve as a common electrode of the light emitting device.

In an implementation, the second electrode 160 may extend to or around a lower surface of the first electrode 140, and may partially overlap the first electrode 140 in the vertical direction V substantially perpendicular to the upper surface of the substrate 200 (e.g., such that a portion of the second electrode 160 may be between the first electrode 140 and the substrate 200 in the vertical direction V). In an implementation, the second electrode 160 may entirely cover or overlap an edge portion of the lower surface of the first electrode 140.

The first electrode 140 and the second electrode 160 may each independently include a metal, e.g., silver (Ag), titanium (Ti), nickel (Ni), gold (Au), or the like. The first electrode 140 and the second electrode 160 may be respectively connected to the first semiconductor pattern 135 and the second semiconductor pattern 115, and may serve as p-type and n-type electrodes, respectively.

The conductive division pattern 210 may include a metal having a high reflectivity and a low resistance, e.g., silver (Ag), copper (Cu), aluminum (Al), gold (Au), or the like, and may contact (e.g., directly contact) the second electrode 160 to be electrically connected thereto.

The photo-conversion pattern 220 may include a first photo-conversion pattern 220a, a second photo-conversion pattern 220b, and a third photo-conversion pattern 220c. In an implementation, a plurality of first photo-conversion patterns 220a, a plurality of second photo-conversion patterns 220b, and a plurality of third photo-conversion patterns 220c may be formed to be spaced apart from each other, respectively, in the horizontal direction H.

The first to third photo-conversion patterns 220a, 220b and 220c may include different materials from each other, and lights emitted from the light emitting structures may penetrate through the first to third photo-conversion patterns 220a, 220b and 220c so that a red light, a green light, and a blue light may be generated, respectively.

In an implementation, each of the first to third photo-conversion patterns 220a, 220b and 220c may include a wavelength conversion material, which may absorb a light from the light emitting structure to emit a light having a different wavelength. In an implementation, the wavelength conversion material may include a quantum dot or a fluorescent substance.

Figure 2B:
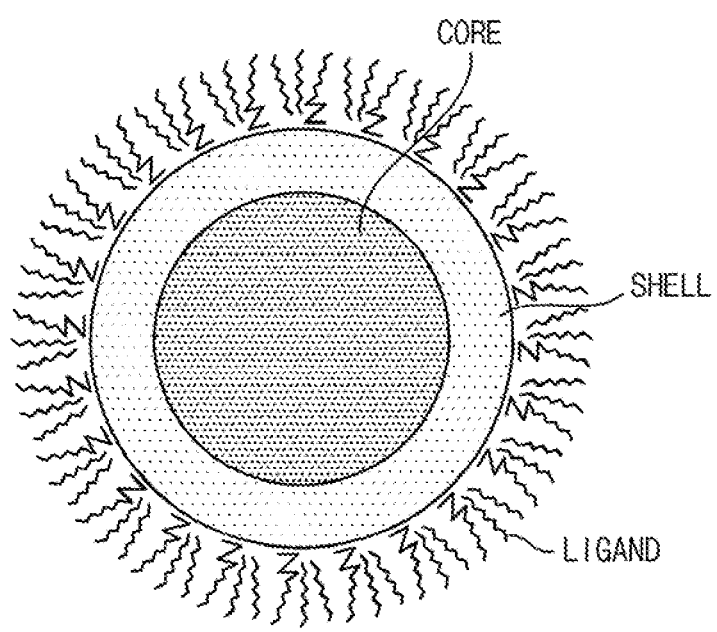
FIG. 2B is a cross-sectional view of a quantum dot (QD) in accordance with example embodiments.

FIG. 2B is a cross-sectional view of a quantum dot (QD) in accordance with example embodiments.

In an implementation, the QD may have a core-shell structure including III-V semiconductor compounds or II-VI semiconductor compounds. The core may include, e.g., CdSe, InP, or the like, and the shell may include, e.g., ZnS, ZnSe, or the like. The QD may further include ligand for stabilizing the core and the shell.

In an implementation, the core may have a diameter of, e.g., about 1 nm to about 30 nm. In an implementation, the core may have a diameter of, e.g., about 3 nm to about 10 nm.

The QD may generate various colors depending on a size thereof, and when the QD is used as a fluorescent substance, it may be a red or green fluorescent substance. The QD may have a small half-width of about 35 nm.

As described above, the second electrode 160 may surround and contact (e.g., directly contact) the sidewall of the second semiconductor pattern 115, and a space for forming the second electrode 160 on upper and lower surfaces of the second semiconductor pattern 115 is not needed. The semiconductor light emitting device may have an improved integration degree. The second electrode 160 may contact (e.g., directly contact) the upper sidewall of the second semiconductor pattern 115, and may not contact (e.g., may be spaced apart from) the first semiconductor pattern 135 and the first electrode 140 due to the insulation pattern 155.

In an implementation, the second electrode 160 may extend in the horizontal direction H to entirely cover the first electrodes 140, the light emitting structures, and the insulation patterns 155, and thus may serve as a common electrode of the semiconductor light emitting device.

The first and second electrodes 140 and 160 may each independently include a metal that may reflect light, and the second electrode 160 may extend to or around the lower surface of the first electrode 140 to entirely cover the edge of the lower surface of the first electrode 140. In an implementation, light emitted from the light emitting structure may not be transmitted downwardly toward the substrate 200, and may be transmitted only upwardly (e.g., in the vertical direction V) toward the photo-conversion pattern 220, so that the semiconductor light emitting device may have reduced light loss.

FIGS. 3 to 18 are plan views and cross-sectional views of stages in a method of manufacturing a semiconductor light emitting device in accordance with example embodiments. FIGS. 3, 5, 7, 9, 11, 15 and 17 are the plan views, and FIGS. 4, 6, 8, 10, 12-14, 16 and 18 are cross-sectional views taken along lines A-A' of corresponding plan views, respectively.

Figure 3:
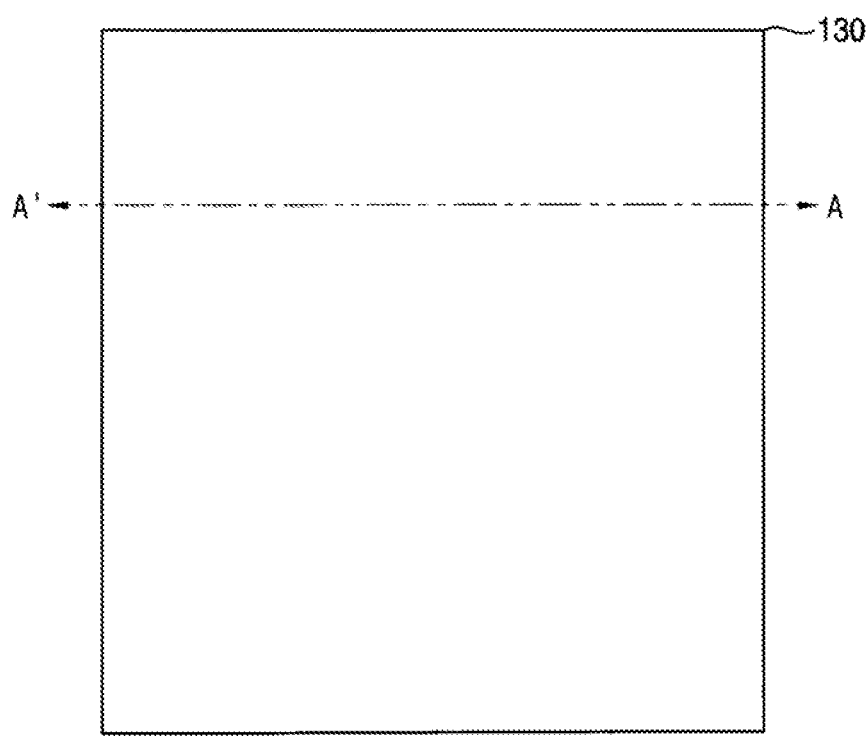
FIGS. 3 to 18 are plan views and cross-sectional views of stages in a method of manufacturing a semiconductor light emitting device in accordance with example embodiments.
Figure 4:
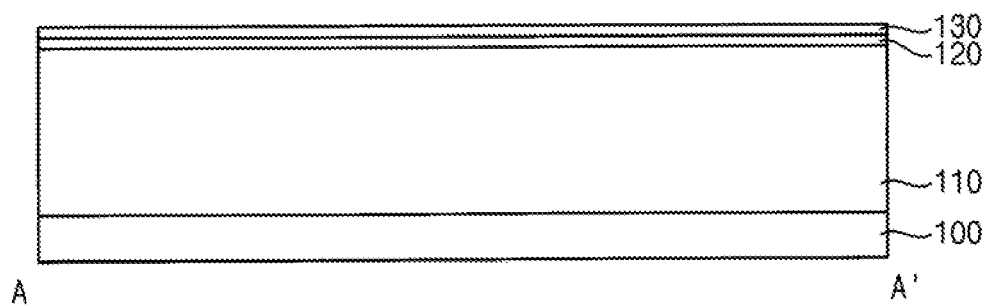

Referring to FIGS. 3 and 4, a second semiconductor layer 110, an active layer 120, and a first semiconductor layer 130 may be sequentially formed on a base substrate 100.

The base substrate 100 may include an insulating material e.g., glass, sapphire, or the like., a semiconductor material, e.g., silicon, silicon carbide, or the like., or a metal oxide, e.g., zinc oxide.

The second semiconductor layer 110, the active layer 120 and the first semiconductor layer 130 may be formed by a metal organic chemical vapor deposition (MOCVD) process, a hydride vapor phase epitaxy (HVPE) process, a sputtering process, or the like.

In an implementation, the second semiconductor layer 110 may have a thickness (e.g., as measured in the vertical direction V) greater than those of the active layer 120 and the first semiconductor layer 130. The active layer 120 may be conformally formed on the second semiconductor layer 110, and the first semiconductor layer 130 may be conformally formed on the active layer 120.

In an implementation, as illustrated in FIG. 4, the active layer 120 and the first semiconductor layer 130 may have substantially the same thickness. In an implementation, the active layer 120 and the first semiconductor layer 130 may have different thicknesses from each other.

The second semiconductor layer 110 may include, e.g., gallium nitride (GaN) doped with silicon (Si), germanium (Ge), selenium (Se), tellurium (Te), or carbon (C), aluminum gallium nitride (AlGaN), or indium gallium nitride (InGaN), and may have an n-type conductivity.

The active layer 120 may include indium gallium nitride (InGaN), and may have a quantum well (QW) structure.

The first semiconductor layer 130 may include gallium nitride (GaN) doped with magnesium, aluminum gallium nitride (AlGaN), indium gallium nitride (InGaN), or the like, and may have a p-type conductivity.

In an implementation, a buffer layer may be further formed between the base substrate 100 and the second semiconductor layer 110, and may help reduce the lattice mismatch therebetween. The buffer layer may include, e.g., gallium nitride (GaN).

Figure 5:
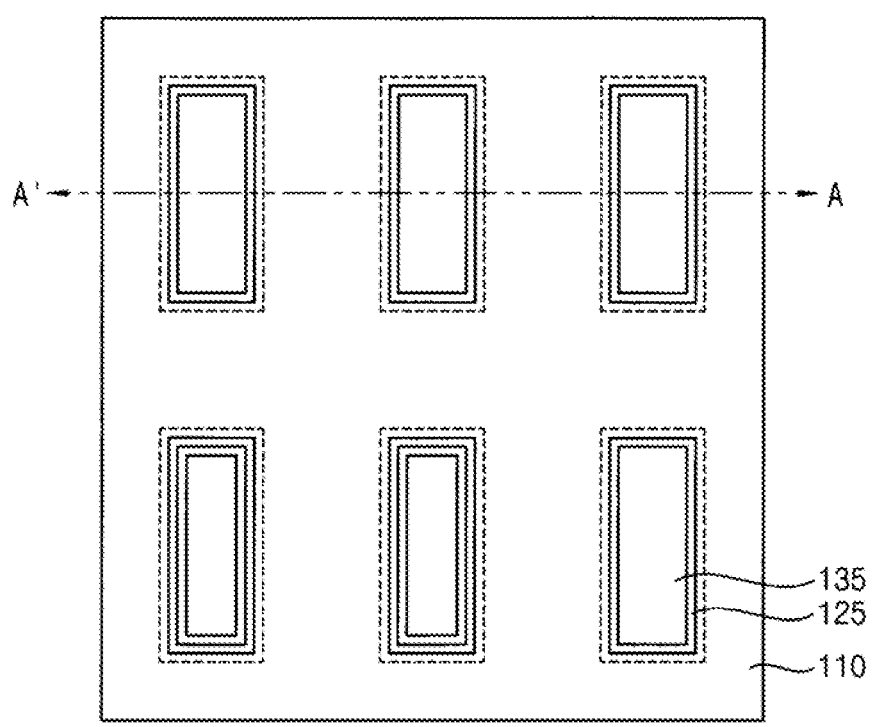
Figure 6:
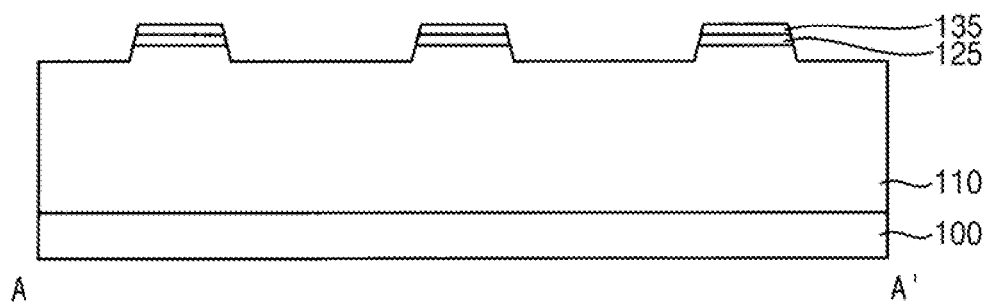

Referring to FIGS. 5 and 6, a first etching mask may be formed on the first semiconductor layer 130, and a first etching process may be performed using the first etching mask to partially etch the first semiconductor layer 130, the active layer 120, and an upper portion of the second semiconductor layer 110 (e.g., a portion of the second semiconductor layer 110 proximate to the first semiconductor layer 130 and the active layer 120). In an implementation, the first semiconductor layer 130 and the active layer 120 may be patterned into a first semiconductor pattern 135 and an active pattern 125, respectively, and the second semiconductor layer 110 may include a first portion under the active pattern 125 and a second portion having an upper surface lower than (e.g., closer to the base substrate 100 in the vertical direction V) that of the first portion.

The first portion of the second semiconductor layer 110, the active pattern 125, and the first semiconductor pattern 135 (sequentially stacked) may have a mesa shape in which an upper surface (e.g., surface facing away from the base substrate 100 in the vertical direction V) is flat and a width gradually increases from a top toward a bottom thereof (e.g., toward the base substrate 100 in the vertical direction V), which may be referred to as a first mesa structure.

The first etching mask may have a shape of a circle or a polygon such as a rectangle in a plan view, and the first semiconductor pattern 135, the active pattern 125, and the first portion of the second semiconductor layer 110 thereunder may also have a shape of a circle or a polygon such as a rectangle in a plan view.

In an implementation, a plurality of first mesa structures may be spaced apart from each other in the horizontal direction H.

The first etching mask may include an insulating material, e.g., silicon oxide or silicon nitride.

Figure 7:
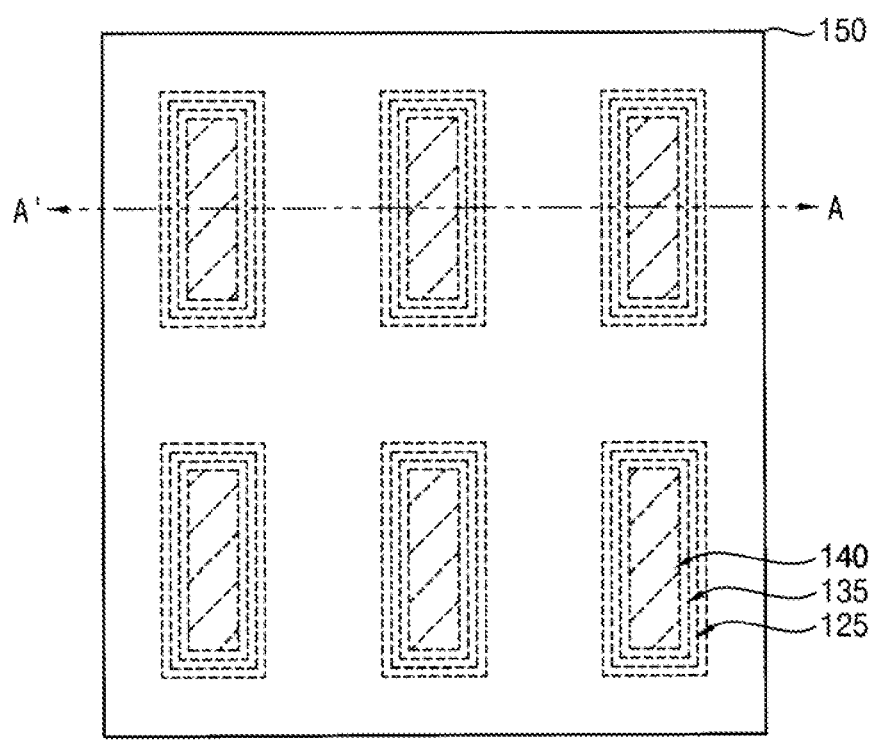
Figure 8:
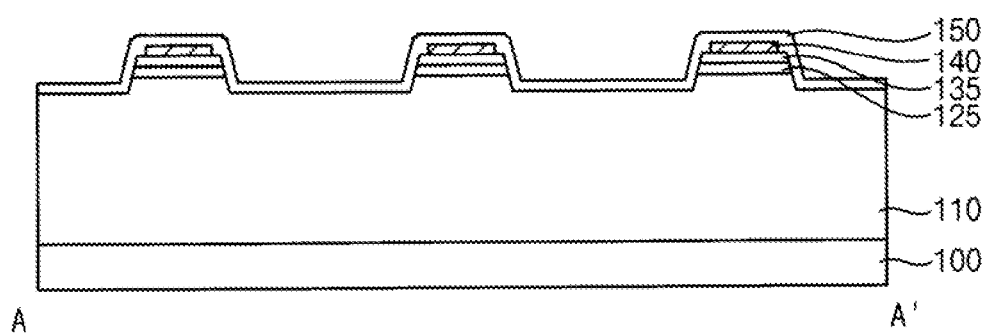

Referring to FIGS. 7 and 8, a first electrode 140 may be formed on the first mesa structure, and an insulation layer 150 may be formed on the first electrode 140, the first mesa structure, and the second portion of the second semiconductor layer 110.

In an implementation, the first electrode 140 may be formed by forming a first mask having a first opening on the first semiconductor pattern 135, and filling the first opening with a metal. A width (e.g., in the horizontal direction H) of the first opening may be smaller than that of the first semiconductor pattern 135, and a width of the first electrode 140 filling the first opening may also be smaller than that of the first semiconductor pattern 135.

In an implementation, the first electrode 140 may have a shape similar to that of the first semiconductor pattern 135 or the active pattern 125, e.g., a shape of a circle or a polygon such as a rectangle.

In an implementation, the first electrode 140 may have a thickness (e.g., in the vertical direction V) substantially the same as that of the first semiconductor pattern 135 and the active pattern 125. In an implementation, the first electrode 140 may have a thickness different from that of the first semiconductor pattern 135 and the active pattern 125.

In an implementation, a plurality of first electrodes 140 may be formed (e.g., spaced apart in the horizontal direction H) to correspond with the plurality of first mesa structures spaced apart in the horizontal direction H.

The first electrode 140 may include a metal, e.g., silver (Ag), titanium (Ti), nickel (Ni), gold (Au), or the like. The first electrode 140 may be connected to the first semiconductor pattern 135, and may serve as a p-type electrode. In an implementation, a transparent electrode may be further formed between the first electrode 140 and the first semiconductor pattern 135, which may include, e.g., indium tin oxide (ITO).

After removing the first mask, an insulation layer 150 may be formed to cover the first electrode 140, the first mesa structure, and the second portion of the second semiconductor layer 110. The insulation layer 150 may include an insulating material, e.g., silicon oxide, silicon nitride, or the like.

Figure 9:
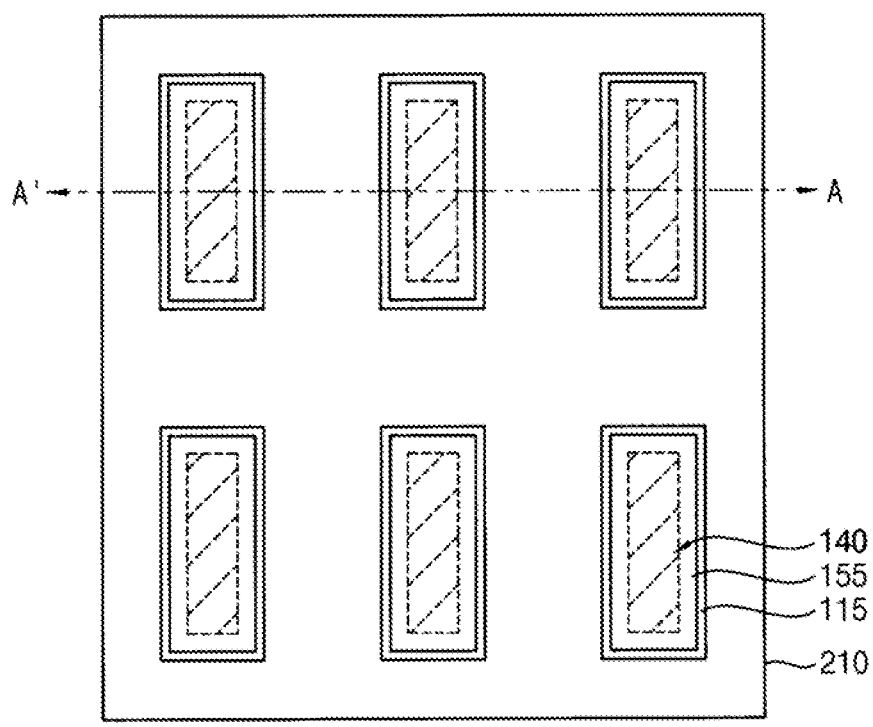
Figure 10:
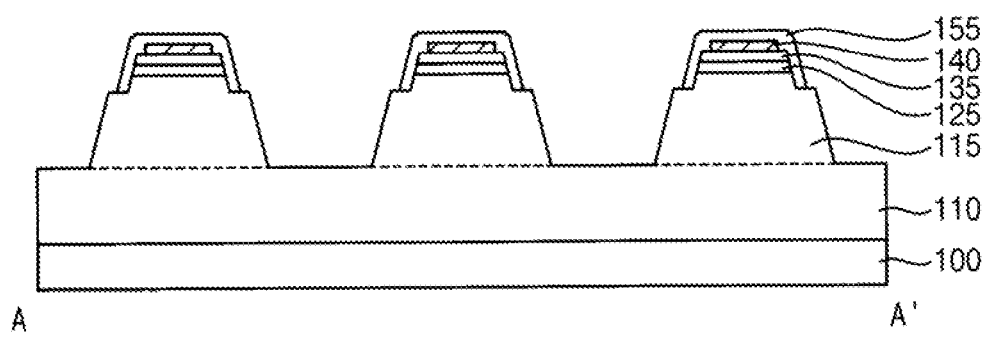

Referring to FIGS. 9 and 10, a second etching process may be performed on the insulation layer 150 to form an insulation pattern 155, and a third etching process may be performed on the second portion of the second semiconductor layer 110 to form a second semiconductor pattern 115.

The second etching process may be performed using a second etching mask covering a portion of the insulation layer 150 on the first mesa structure and the first electrode 140, and a portion of the insulation layer 150 not covered by the second etching mask may be etched by the second etching process until the upper surface of the second portion of the second semiconductor layer 110 is exposed. In an implementation, the insulation pattern 155 may be formed to cover an upper surface and a sidewall of the first electrode 140, an upper surface and a sidewall of the first mesa structure, and a portion of the upper surface of the second portion of the second semiconductor layer 110. In an implementation, a plurality of insulation patterns 155 may be formed to be spaced apart from each other in the horizontal direction H.

The third etching process may be performed using a third etching mask covering the insulation pattern 155 and a portion of the second portion of the second semiconductor layer 110 adjacent thereto, and a portion of the second portion of the second semiconductor layer 110 not covered by the third etching mask may be etched by the third etching process. In an implementation, the first and second portions of the second semiconductor layer 110 not etched by the third etching process may be patterned into the second semiconductor pattern 115.

In an implementation, the second semiconductor pattern 115 may include lower and upper portions (e.g., sequentially stacked), and a width (e.g., as measured in the horizontal direction H) of the lower portion may be greater than that of the upper portion. In an implementation, the second semiconductor pattern 115, the active pattern 125, the first semiconductor pattern 135, the first electrode 140, and the insulation pattern 155 sequentially stacked may form a second mesa structure. A plurality of second mesa structures may be spaced apart from each other in the horizontal direction H.

The second semiconductor pattern 115, the active pattern 125, and the first semiconductor pattern 135 in the second mesa structure may form a light emitting structure.

In an implementation, each of the insulation pattern 155 and the second semiconductor pattern 115 may have a sidewall that is not perpendicular to the upper surface of the base substrate 100 (e.g., may have an inclined sidewall). A slope of the sidewall of the insulation pattern 155 may be the same as or different from that of the sidewall of the second semiconductor pattern 115.

Figure 11:
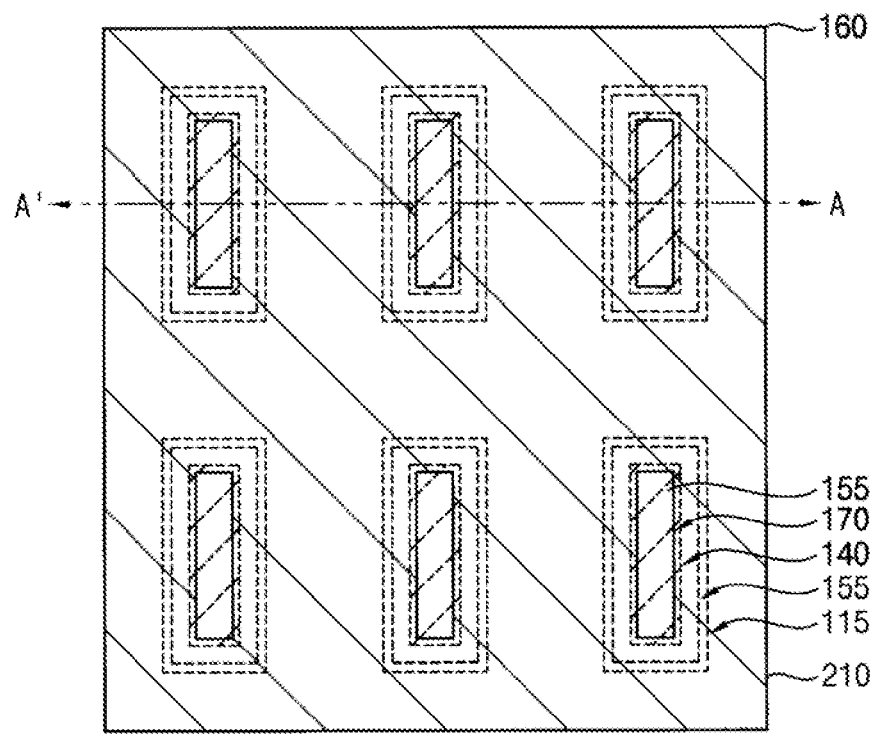
Figure 12:
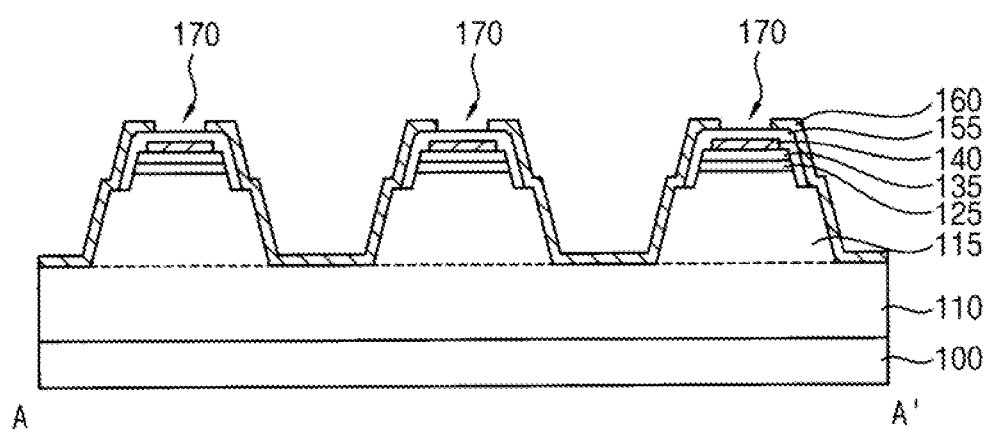

Referring to FIGS. 11 and 12, a second electrode 160 may be formed on the base substrate 100 to entirely cover the second semiconductor layer 110 and the plurality of second mesa structures except for a portion of an upper surface of each of the plurality of second mesa structures.

In an implementation, the second electrode 160 may be formed by conformally forming a second electrode layer on the base substrate 100 (having the second mesa structures thereon), and removing a portion of the second electrode layer on, e.g., a central upper surface of the first electrode 140 of each of the second mesa structures. In an implementation, a second opening 170 may be formed to partially expose an upper surface of the insulation pattern 155 at a central upper surface of each of the second mesa structures.

The second electrode 160 may extend in the horizontal direction H to contact an upper surface of the second semiconductor layer 110, a sidewall and a portion of an upper surface of the lower portion of the second semiconductor pattern 115, and a sidewall and a portion of an upper surface of the insulation pattern 155, and may overlap an edge portion of an upper surface of the first electrode 140 in the vertical direction V. The active pattern 125, the first semiconductor pattern 135 and the first electrode 140 may be covered by the insulation pattern 155, and may not contact the second electrode 160. A part of the upper portion of the second semiconductor pattern 115 may be covered by the insulation pattern 155, and may not contact the second electrode 160.

In an implementation, the second electrode 160 may include a first portion contacting a sidewall and an upper surface of each of the second mesa structures, and a second portion extending in the horizontal direction H on the second semiconductor layer 110. In an implementation, the first portion of the second electrode 160 may have a twisty, inclined, or bent shape in the vertical direction V.

The second electrode 160 may include the same material as the first electrode 140, e.g., a metal such as silver (Ag), titanium (Ti), nickel (Ni), gold (Au), or the like. The second electrode 160 may be connected to the second semiconductor pattern 115 having an n-type conductivity, and may serve as an n-type electrode. A transparent electrode may be further formed between the second electrode 160 and the second semiconductor pattern 115, which may include, e.g., indium tin oxide (ITO).

Figure 13:
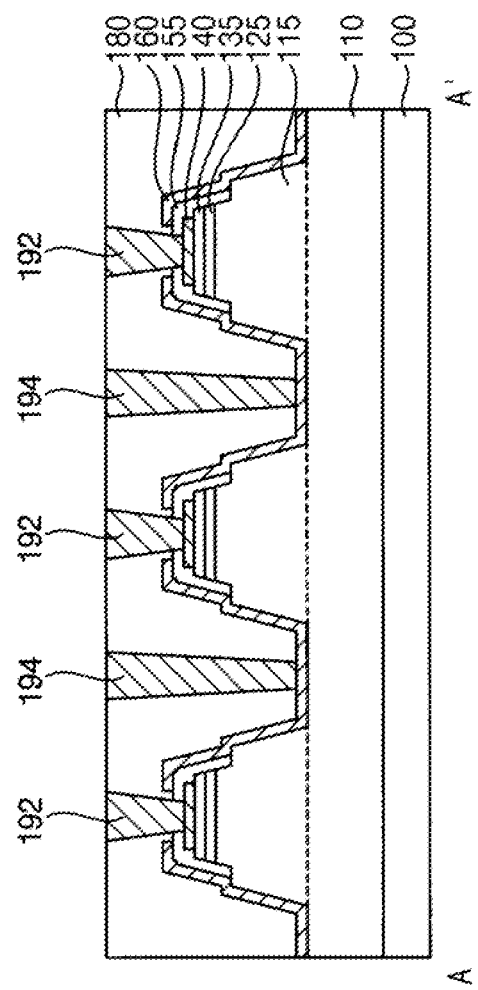

Referring to FIG. 13, an insulating interlayer 180 may be formed to cover the second electrode 160 and the portion of the upper surface of the insulation pattern 155 exposed by the second opening 170. A first contact plug 192 may be formed through the insulating interlayer 180 and the insulation pattern 155 to contact (e.g., directly contact) the first electrode 140, and a second contact plug 194 may be formed through the insulating interlayer 180 to contact (e.g., directly contact) the second electrode 160.

In an implementation, as illustrated in FIG. 13, the first and second contact plugs 192 and 194 may be alternately and repeatedly formed in or along the horizontal direction H. In an implementation, the second electrode 160 may serve as a common electrode for the semiconductor light emitting device, and a number of the second contact plug 194 that contact and are connected to the second electrode 160 may be changed. In an implementation, at least one second contact plug 194 may contact the second electrode 160 to be electrically connected thereto.

In an implementation, a plurality of first contact plugs 192 and a plurality of second contact plugs 194 may be spaced apart from each other in the horizontal direction H. Each of the first and second contact plugs 192 and 194 may have a pillar shape, or a linear shape extending in a direction.

Figure 14:
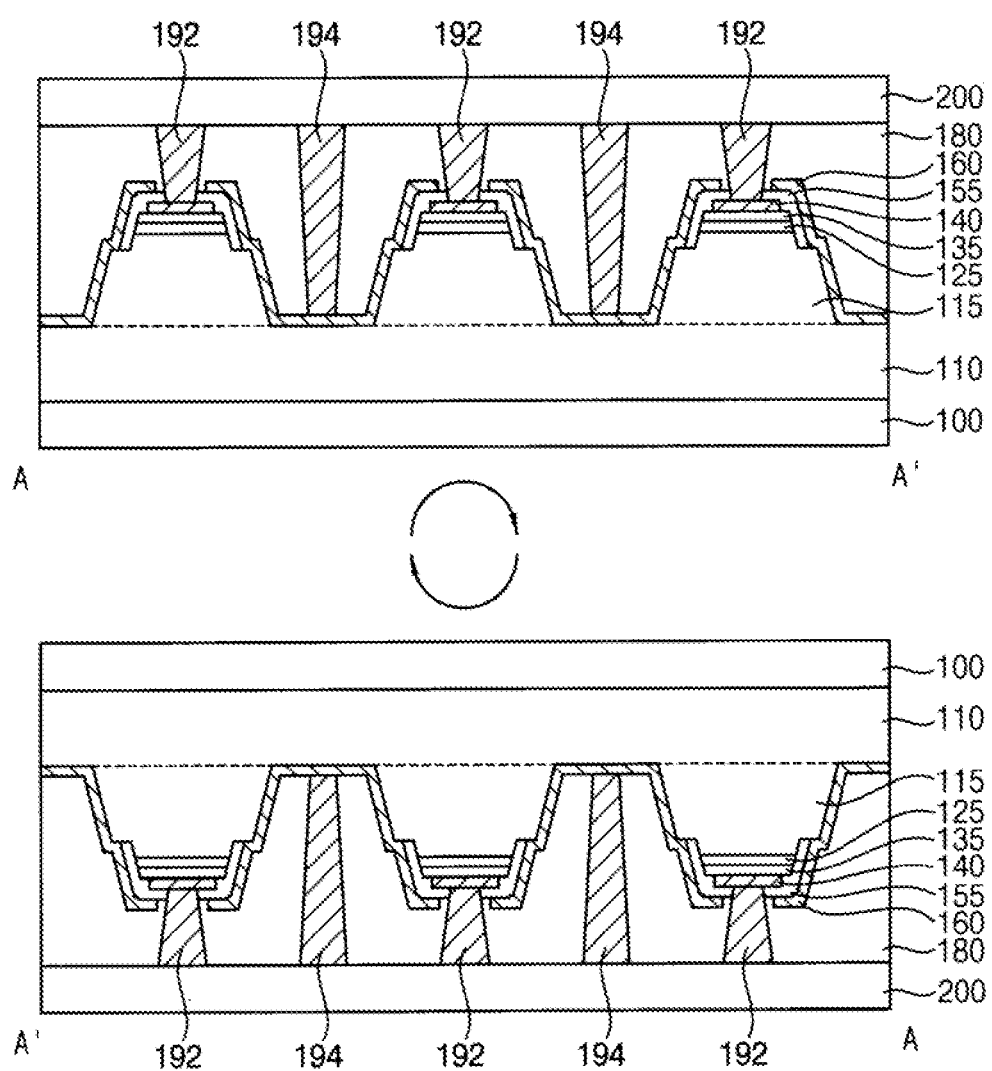

Referring to FIG. 14, a substrate 200 may be bonded to the insulating interlayer 180 having the first and second contact plugs 192 and 194 therein, and the base substrate 100 may be upended using the substrate 200.

In an implementation, a lower surface of the base substrate 100 may face upwardly in the vertical direction V, and the structures on the base substrate 100 may be disposed upside down. Hereinafter, lower and upper portions of the structures on the base substrate 100 may be referred to as upper and lower portions, respectively.

The substrate 200 may include substantially the same material as the base substrate 100, e.g., an insulating material such as glass, sapphire, or the like, a semiconductor material such as silicon, silicon carbide, or the like, or a metal oxide such as zinc oxide. A driver IC may be buried in the substrate 200, and the driver IC and the first and second contact plugs 192 and 194 may be electrically connected with each other.

Figure 15:
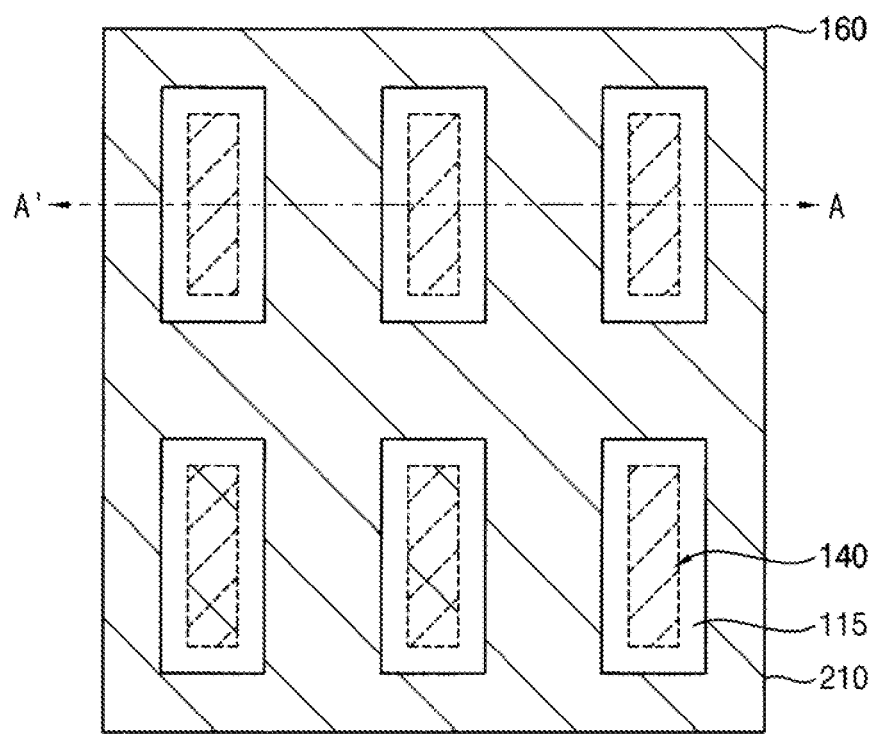
Figure 16:
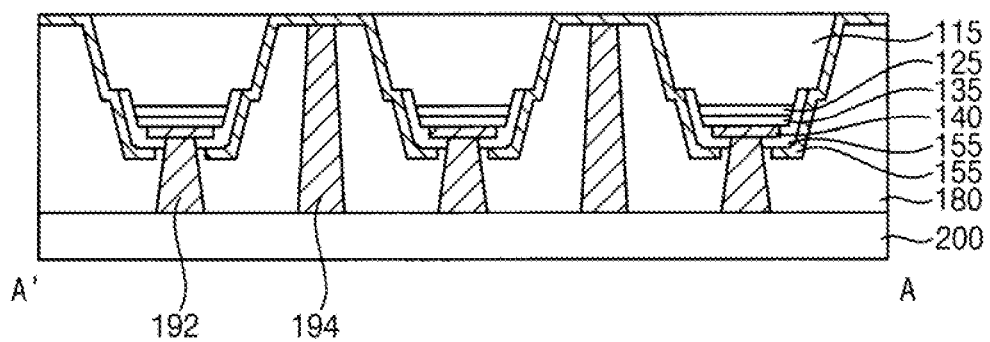

Referring to FIGS. 15 and 16, the base substrate 100 and the second semiconductor layer 110 may be removed, and upper surfaces of the second electrode 160 and the second semiconductor pattern 115 may be exposed.

In an implementation, the base substrate 100 may be removed by a grinding process and/or a CMP process.

Figure 17:
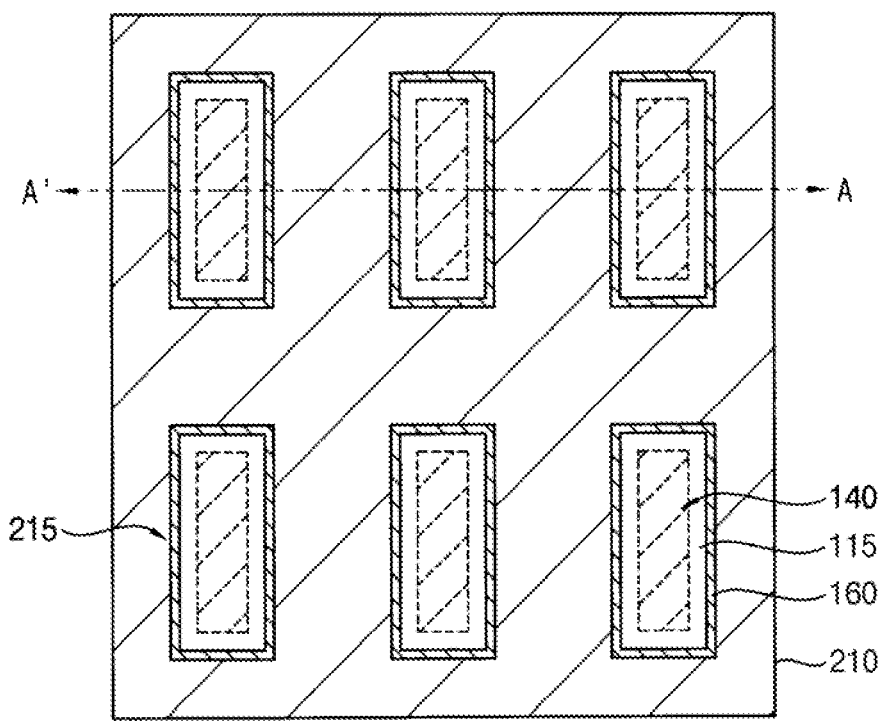
Figure 18:
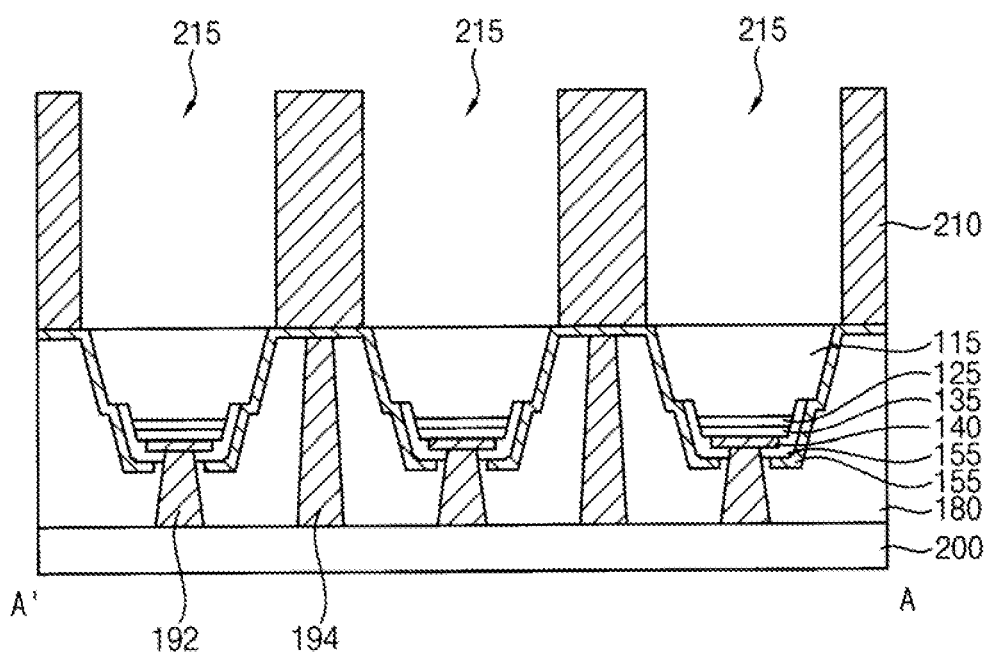

Referring to FIGS. 17 and 18, a conductive division pattern 210 may be formed on the second portion of the second electrode 160.

In an implementation, the conductive division pattern 210 may be formed by forming a second mask including a third opening on the upper surfaces of the second electrode 160 and the second semiconductor pattern 115, and performing an electroplate process so that a conductive material may fill the third opening.

The conductive division pattern 210 may include a material having a high reflectivity and a low resistance, e.g., a metal such as silver (Ag), copper (Cu), gold (Au), or the like, and may contact (e.g., directly contact) the second portion of the second electrode 160 to be electrically connected thereto.

The second mask may be removed to form a fourth opening 215 exposing the upper surface of the second semiconductor pattern 115 and a portion of the upper surface of the second portion of the second electrode 160 adjacent thereto.

In an implementation, the fourth opening 215 may have a shape of a circle or a polygon such as a rectangle, in a plan view.

Referring to FIGS. 1 and 2A, a photo-conversion pattern 220 may be formed on the upper surface of the second semiconductor pattern 115 and the portion of the upper surface of the second portion of the second electrode 160 exposed by the fourth opening 215 so as to complete the fabrication of the semiconductor light emitting device.

The photo-conversion pattern 220 may include the first to third photo-conversion patterns 220a, 220b and 220c, and the first to third photo-conversion patterns 220a, 220b and 220c may fill the fourth opening 215. In an implementation, the first to third photo-conversion patterns 220a, 220b and 220c may be spaced apart from each other in the horizontal direction H.

The first to third photo-conversion patterns 220a, 220b and 220c may include different materials, and light emitted from the light emitting structures may penetrate through the first to third photo-conversion patterns 220a, 220b and 220c to be converted into, e.g., red light, green light, and blue light, respectively.

In an implementation, the photo-conversion pattern 220 may include a wave-conversion or wavelength-conversion material. In an implementation, when the light emitting structure emits an ultraviolet light, the first photo-conversion pattern 220a may include a material for converting the light into a red light, the second photo-conversion pattern 220b may include a material for converting the light into a green light, and the third photo-conversion pattern 220c may include a material for converting the light into a blue light. In an implementation, some of the photo-conversion patterns 220 may not include a wave-conversion material. In an implementation, when the light emitting structures emit a blue light, the third photo-conversion pattern 220c may not include a wave-conversion material.

The wave-conversion material may absorb a light emitted from the light emitting structure to generate a light having a different wavelength therefrom. The wave-conversion material may include a QD and/or a fluorescent substance.

In an implementation, the fluorescent substance may have the following color and composition depending on the material thereof.

Oxide: yellow and green; $Y_3Al_5O_{12}$:Ce, $Tb_3Al_5O_{12}$:Ce, $Lu_3Al_5O_{12}$:Ce Silicate: yellow and green; $(Ba, Sr)_2SiO_4$:Eu, yellow and orange; $(Ba, Sr)_3SiO_5$:Ce Nitride: green; SiAlON:Eu, yellow; $La_3SiN_{11}$:Ce, orange; SiAlON:Eu, red; $CaAlSiN_3$:Eu, $Sr_2Si_5N_8$:Eu, $SrSIAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5=x=3$, $0<z<0.3$, $0<y=4$), Ln is at least one of IIIA and rare-earth elements, and M is at least one of Ca, Ba, Sr and Mg.

Fluoride: KSF red; $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$MN_4^+$ The fluorescent substance has to satisfy stoichiometry, and each element may be replaced with another one of the same group in the periodic table. In an implementation, Sr may be replaced with Ba, Ca, Mg, etc., of the alkaline earth metal group, Y may be replaced with Tb, Lu, Sc, Gd, etc., of the lanthanum group. An activator such as Eu may be replaced with Ce, Tb, Pr, Er, Yb, etc., depending on the desired energy level, and may be used alone or in combination with a sub-activator.

The fluoride red fluorescent substance may be coated with fluoride not containing Mn, or may be further coated with an organic material, in order to improve reliability at a high temperature or at a high humidity.

In an implementation, the wave-conversion material may be contained in an encapsulant to thus be attached. In an implementation, the wave-conversion material may be formed as a film and attached. In this case, the film-type wave-conversion material may be applied to an area where a wave-conversion material having a constant thickness is used.

As described above, the second electrode 160 may surround and contact (e.g., directly contact) the sidewall of the second semiconductor pattern 115, and a dedicated space for forming the second electrode 160 on an upper surface or a lower surface of the second semiconductor pattern 115 is not needed, so as to increase the integration degree of the semiconductor light emitting device. The second electrode 160 may contact (e.g., directly contact) the sidewall of the upper portion of the second semiconductor pattern 115, and may not contact the first semiconductor pattern 135 and the first electrode 140 due to the presence of the insulation pattern 155.

The second electrode 160 may extend in the horizontal direction to (e.g., almost) entirely cover or surround the first electrodes 140, the light emitting structures, and the insulation patterns 155, and may serve as a common electrode of the semiconductor light emitting device.

The first and second electrodes 140 and 160 may include a material that may reflect light, and the second electrode 160 may extend to or around the lower surface of the first electrode 140 to entirely cover an outer edge portion of the lower (e.g., substrate 200-facing) surface of the first electrode 140. In an implementation, light emitted from the light emitting structure may not penetrate downwardly (e.g., toward the substrate 200 in the vertical direction V), but rather may penetrate or be emitted upwardly (e.g., away from the substrate 200 in the vertical direction V) toward the photo-conversion pattern 220, which may help decrease a loss of light.

FIGS. 19 to 23 are cross-sectional views of stages in a method of manufacturing a semiconductor light emitting device. FIGS. 19 to 23 are cross-sectional views taken along lines A-A' of corresponding plan views, respectively.

This method may include processes substantially the same as or similar to those illustrated with reference to FIGS. 3 to 18, and repeated explanations may be omitted herein.

Figure 19:
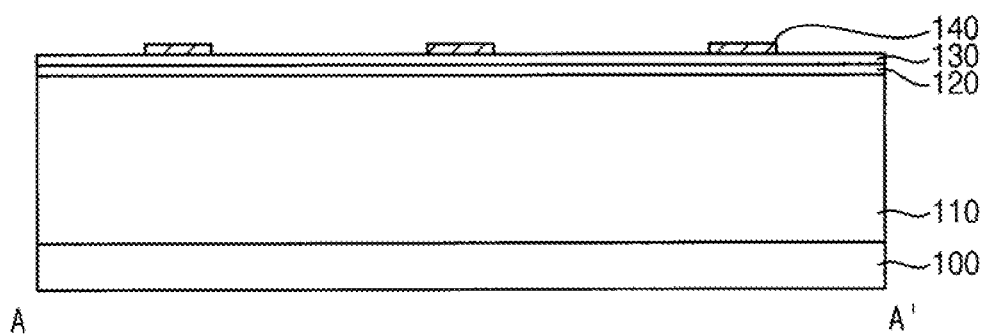
FIGS. 19 to 23 are cross-sectional views of stages in a method of manufacturing a semiconductor light emitting device.

Referring to FIG. 19, processes substantially the same as or similar to those illustrated with reference to FIGS. 3 and 4 may be performed, and the first electrode 140 may be formed without performing the first etching process.

The second semiconductor layer 110, the active layer 120, and the first semiconductor layer 130 may be sequentially formed on the base substrate 100, the first mask having the first opening may be formed, and the first electrode 140 may be formed in the first opening. The first etching process may not be performed before the formation of the first electrode 140, and the first semiconductor layer 130, the active layer 120, and the upper portion of the second semiconductor layer 110 may not be removed.

In an implementation, a plurality of first electrodes 140 may be formed to be spaced apart from each other in the horizontal direction H, and each of the first electrodes 140 may have a shape of, e.g., a polygon such as a rectangle.

Figure 20:
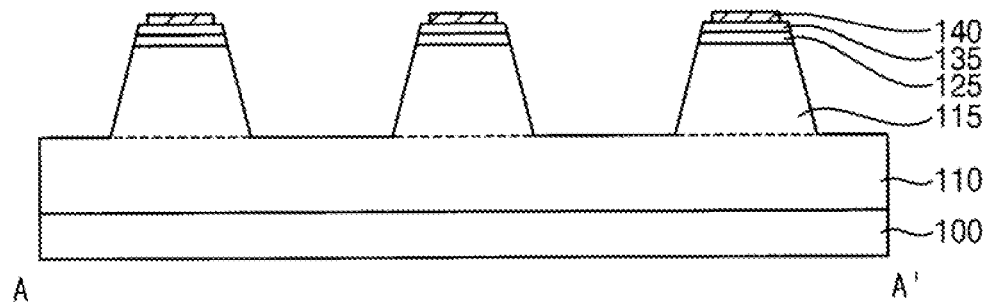

Referring to FIG. 20, processes substantially the same as or similar to those illustrated with reference to FIGS. 7 to 10 may be performed. In an implementation, after forming the first electrode 140, the third etching process may be performed to divide the light emitting structure before forming the insulation layer.

In an implementation, a fourth etching mask may be formed on the first semiconductor layer 130 to cover the first electrode 140, and the third etching process may be performed using the fourth etching mask to partially remove the first semiconductor layer 130, the active pattern 125, and an upper portion of the second semiconductor layer 110. In an implementation, the first semiconductor layer 130, the active pattern 125, and the second semiconductor layer 110 may be patterned into the first semiconductor pattern 135, the active pattern 125, and the second semiconductor pattern 115, respectively.

Unlike that of FIGS. 7 to 10, the insulation layer 150 may not be formed after forming the first electrode 140, and the second etching process for patterning the insulation layer 150 may not be performed.

In an implementation, the light emitting structure including the second semiconductor pattern 115, the active pattern 125, and the first semiconductor pattern 135 (sequentially stacked) may have a sidewall slanted or inclined with respect to the upper surface of the base substrate 100, and the sidewall of the light emitting structure may have a constant slope (e.g., may be flat).

In an implementation, a width (e.g., as measured in the horizontal direction H) of the first electrode 140 may be smaller than that of the first semiconductor pattern 135.

Figure 21:
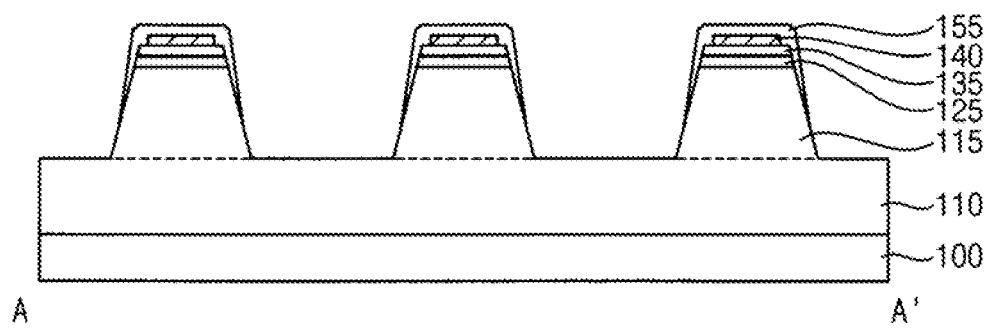

Referring to FIG. 21, the insulation layer may be formed on the first electrode 140, the light emitting structure, and the second semiconductor layer 110, and a fifth etching mask may be formed on the insulation layer. A fourth etching process may be performed using a fifth etching mask so that the insulation layer may be patterned into the insulation pattern 155. A width (e.g., in the horizontal direction H) of the fifth etching mask may be greater than that of the active pattern 125, and a width of the insulation pattern 155 formed using the fifth etching mask may be greater than that of the active pattern 125.

In an implementation, the insulation pattern 155 may cover an upper surface (e.g., surface facing away from the base substrate 100 in the vertical direction V) and a sidewall of the first electrode 140, a portion of an upper surface and a sidewall of the first semiconductor pattern 135, a sidewall of the active pattern 125, and an upper sidewall of the second semiconductor pattern 115 (e.g., a sidewall of a portion of the second semiconductor pattern 115 that is distal to the base substrate 100 in the vertical direction V).

In an implementation, a plurality of insulation patterns 155 may be formed to be spaced apart in the horizontal direction H (e.g., corresponding with positions of the light emitting structures to be formed).

Figure 22:
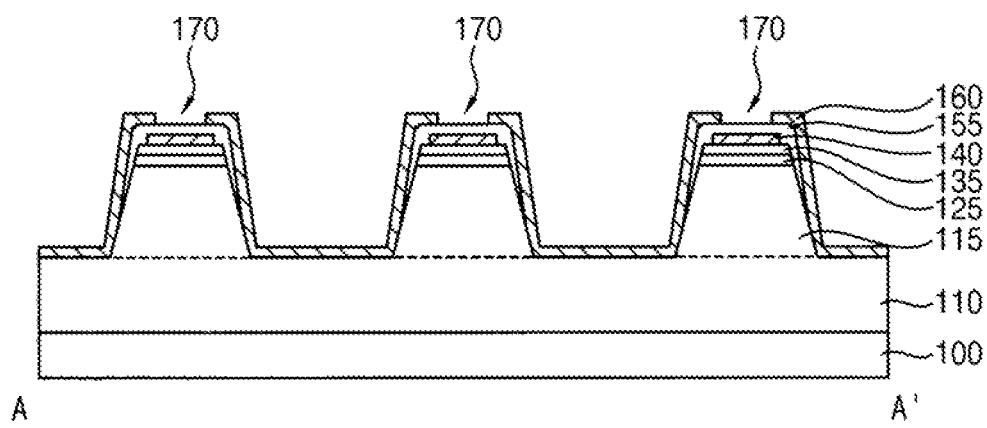

Referring to FIG. 22, processes substantially the same as or similar to those illustrated with reference to FIGS. 11 and 12 may be performed.

The second electrode 160 may be formed to entirely cover the structures on the base substrate 100 except for a portion of an upper surface of the second mesa structure (including the light emitting structure, the first electrode 140, and the insulation pattern 155). The second opening 170 may expose the portion of the upper surface of the second mesa structure, e.g., a portion of an upper surface of the insulation pattern 155 on a central portion of the first electrode 140.

In an implementation, the second electrode 160 may extend in the horizontal direction H to contact (e.g., directly contact) an upper surface of the second semiconductor layer 110, a lower sidewall of the second semiconductor pattern 115, and a sidewall and a portion of an upper surface of the insulation pattern 155, and may overlap an outer edge portion of an upper surface of the first electrode 140 in the vertical direction V. The active pattern 125, the first semiconductor pattern 135, and the first electrode 140 may be covered by the insulation pattern 155 so as not to contact the second electrode 160. The upper portion of the second semiconductor pattern 115 may be also covered by the insulation pattern 155 so as not to contact the second electrode 160.

In an implementation, the second electrode 160 may include a first portion contacting (e.g., directly contacting) a sidewall and a portion of an upper surface of the second mesa structure adjacent thereto, and a second portion extending in the horizontal direction H on the second semiconductor layer 110.

Figure 23:
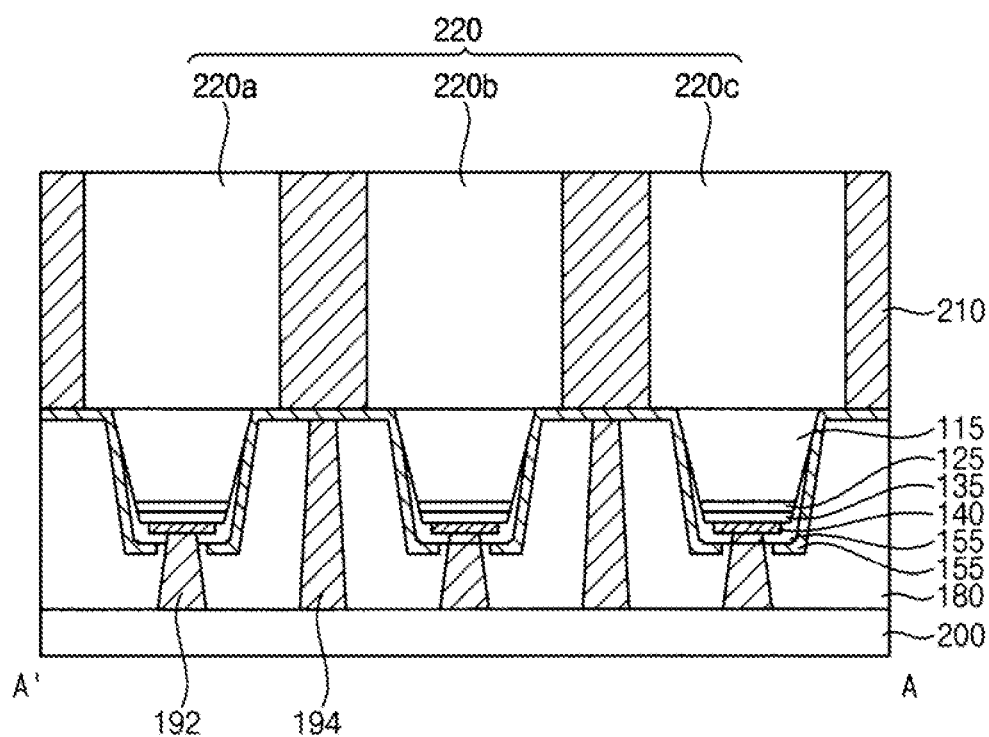

Referring to FIG. 23, processes substantially the same as or similar to those illustrated with reference to FIGS. 13 to 18 and FIGS. 1 and 2 may be performed to complete the fabrication of the semiconductor light emitting devices.

As described above, the second electrode 160 may contact (e.g., directly contact) the sidewall of the second semiconductor pattern 115, a designated space for forming the second electrode 160 on the second semiconductor pattern 115 is not needed, and the mesa process for forming the space may not be performed. The time and cost for manufacturing the semiconductor light emitting device may be reduced.

Figure 24:
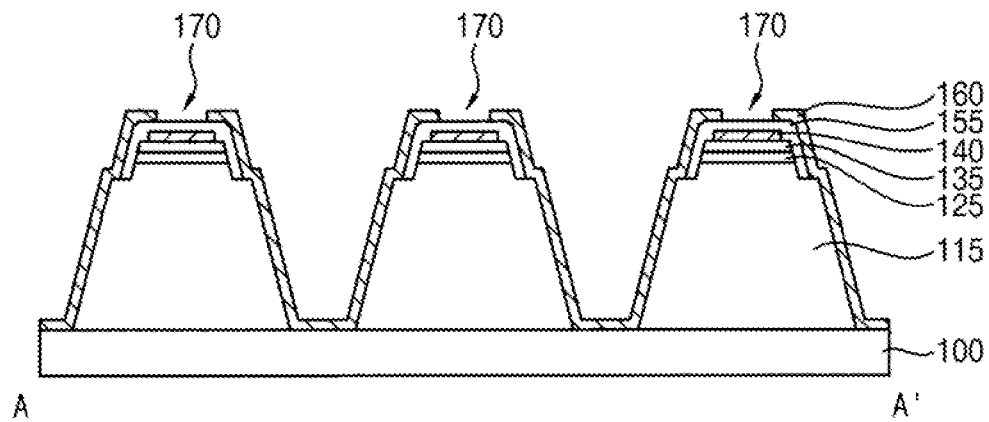
FIGS. 24 to 26 are cross-sectional views of stages in a method of manufacturing a semiconductor light emitting device in accordance with example embodiments.
Figure 25:
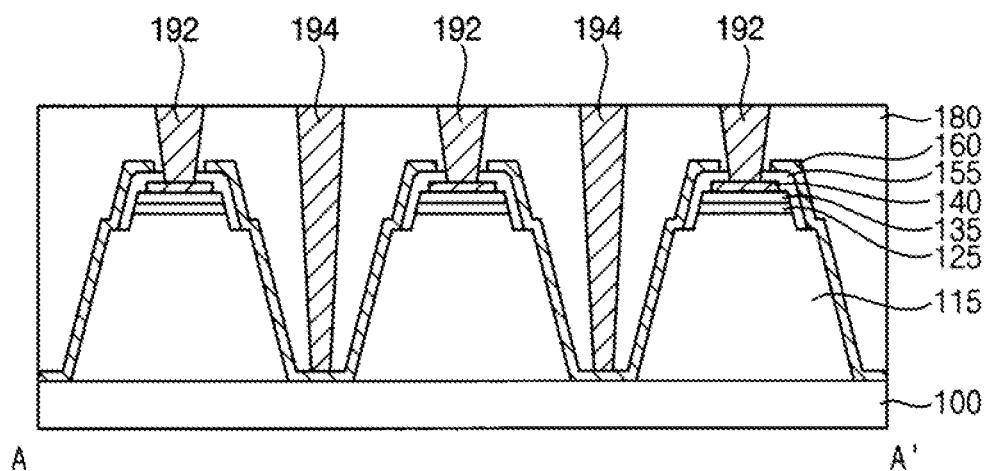
Figure 26:
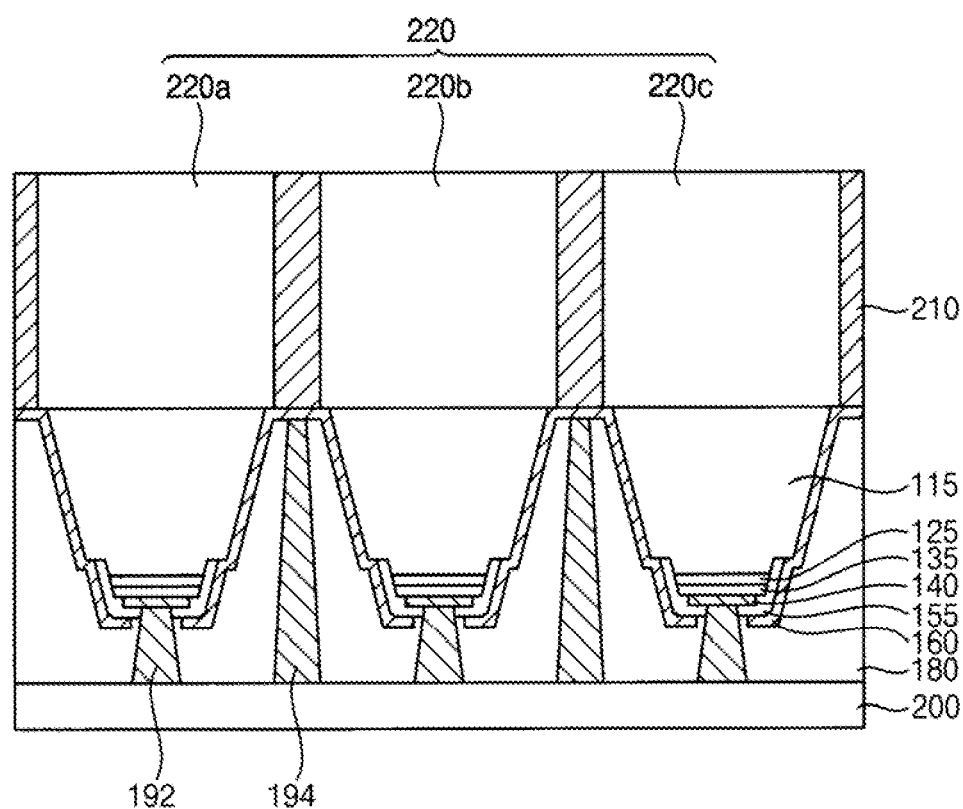

FIGS. 24 to 26 are cross-sectional views of stages in a method of manufacturing a semiconductor light emitting device in accordance with example embodiments. FIGS. 24 to 26 are cross-sectional views taken along lines A-A' of corresponding plan views, respectively.

This method may include processes substantially the same as or similar to those illustrated with reference to FIGS. 3 to 18. Like reference numerals refer to like elements, and repeated descriptions thereon may be omitted herein.

Referring to FIG. 24, processes substantially the same as or similar to those illustrated with reference to FIGS. 3 to 8 may be performed, the second etching process may be performed on the insulation layer 150 to form the insulation pattern 155, and when the third etching process is performed on the portion of the second semiconductor layer 110 exposed by the second etching process, e.g., the second portion of the second semiconductor layer 110, the third etching process may be performed until the upper surface of the base substrate 100 is exposed.

After the third etching process, a plurality of second mesa structures, each of which may include the light emitting structure, the first electrode 140, and the insulation pattern 155, may be formed to be spaced apart from each other in the horizontal direction H, and the second semiconductor layer 110 may not remain under the second mesa structure.

The second electrode layer may be conformally formed on the exposed upper surface of the base substrate 100 and a sidewall and a portion of an upper surface of the second mesa structure adjacent thereto, and a portion of the second electrode layer on a central portion of the first electrode 140 may be removed to form the second electrode 160.

In an implementation, the second electrode 160 may include a first portion contacting (e.g., directly contacting) the sidewall and the portion of the upper surface of the second mesa structure adjacent thereto, and a second portion extending in the horizontal direction H. In an implementation, the first portion of the second electrode 160 may have a twisty, stepped, or bent shape in the vertical direction.

Referring to FIGS. 25 and 26, processes substantially the same as or similar to those illustrated with reference to FIGS. 13 to 18 and FIGS. 1 and 2 may be performed to complete the fabrication of the semiconductor light emitting device.

As described above, the second semiconductor layer 110 may be entirely removed by the third etching process for forming the second mesa structure, and the second semiconductor layer 110 may not be removed when the base substrate 100 is removed, which may help reduce the time and cost for manufacturing the semiconductor light emitting device.

Figure 27:
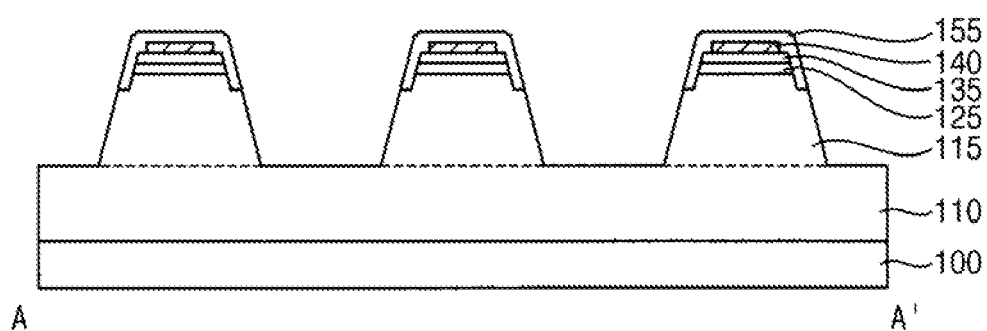
FIGS. 27 to 29 are cross-sectional views of stages in a method of manufacturing a semiconductor light emitting device in accordance with example embodiments.
Figure 28:
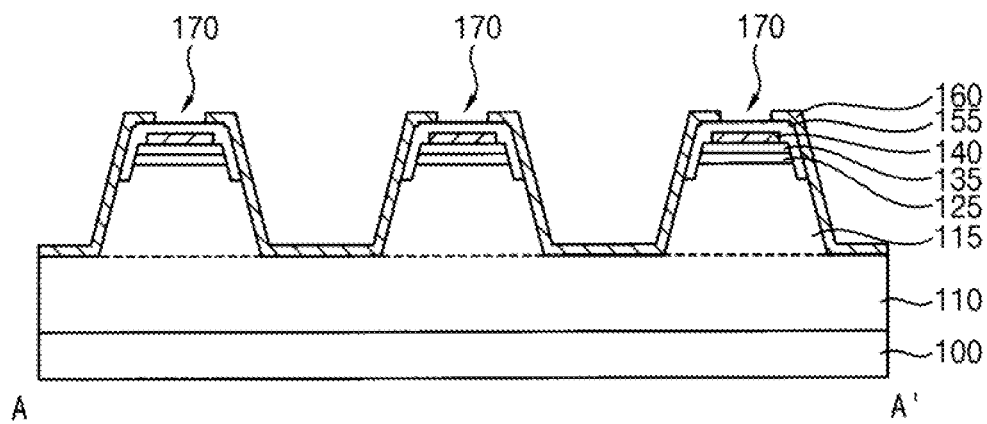
Figure 29:
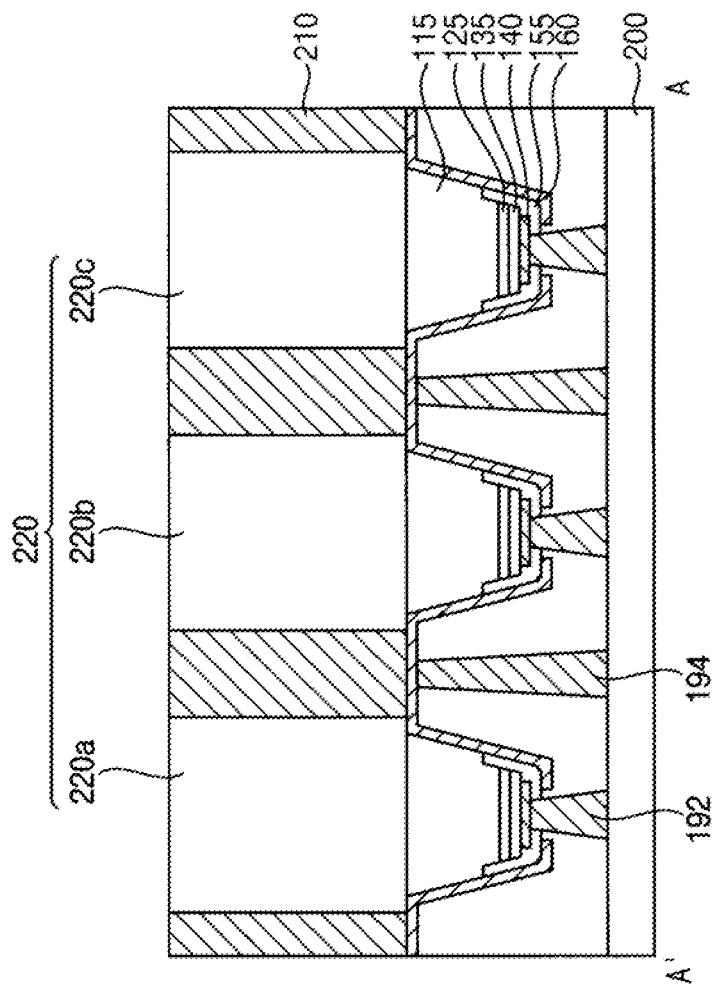

FIGS. 27 to 29 are cross-sectional views of stages in a method of manufacturing a semiconductor light emitting device in accordance with example embodiments. FIGS. 27 to 29 are cross-sectional views taken along lines A-A' of corresponding plan views, respectively.

This method may include processes substantially the same as or similar to those illustrated with reference to FIGS. 3 to 18. Thus, like reference numerals refer to like elements, and repeated descriptions thereon may be omitted herein.

Referring to FIG. 27, processes substantially the same as or similar to those illustrated with reference to FIGS. 3 to 10 may be performed.

In an implementation, unlike the processes illustrated with reference to FIGS. 9 and 10, only one etching process may be performed to form the insulation pattern 155 and the second semiconductor pattern 115.

In an implementation, the second etching process may be performed by forming the second etching mask on the insulation layer 150, and etching a portion of the insulation layer 150 and an upper portion of the second semiconductor layer 110.

In an implementation, each of the insulation pattern 155 and the second semiconductor pattern 115 may have a sidewall slanted or inclined with respect to the upper surface of the base substrate 100, and the sidewalls of the insulation pattern 155 and the second semiconductor pattern 115 may have substantially the same slope. In an implementation, the sidewalls of the insulation pattern 155 and the second semiconductor pattern 115 may have a linear or planar shape (e.g., may be continuously flat or coplanar).

Referring to FIG. 28, processes substantially the same as or similar to those illustrated with reference to FIGS. 11 and 12 may be performed.

In an implementation, the sidewalls of the insulation pattern 155 and the second semiconductor pattern 115 may have the linear shape, and a portion of the second electrode 160 thereon may also have a linear or planar (e.g., flat) shape.

In an implementation, the portion of the second electrode 160 on the sidewalls of the insulation pattern 155 and the second semiconductor pattern 115 may have a constant slope (e.g., may be inclined), and may not be perpendicular to the upper surface of the base substrate 100.

Referring to FIG. 29, processes substantially the same as or similar to those illustrated with reference to FIGS. 13 to 18 and FIGS. 1 and 2 may be performed to complete the fabrication of the semiconductor light emitting device.

By way of summation and review, in order to scale down the light emitting device, elements of the light emitting device may have reduced sizes. A space for forming the second electrode on the first semiconductor pattern may be needed, and there may be a limitation of the scale down of the light emitting device.

One or more embodiments may provide a semiconductor light emitting device having improved characteristics.

In a method of manufacturing the semiconductor light emitting device in accordance with example embodiments, after forming the light emitting structure including the second semiconductor pattern, the active pattern and the first semiconductor pattern sequentially stacked on the base substrate, the second electrode may be formed to surround and contact (e.g., directly contact) the sidewall of the second semiconductor pattern. A separate or designated space for forming the second electrode on the semiconductor pattern may not be needed, so as to increase the integration degree of the light emitting device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor light emitting device, comprising:
at least one light emitting structure on a substrate, the at least one light emitting structure including a first semiconductor pattern, an active pattern, and a second semiconductor pattern sequentially stacked in a vertical direction substantially perpendicular to an upper surface of the substrate;
a first electrode contacting a substrate-facing surface of the first semiconductor pattern; and a second electrode at least partially surrounding and contacting a sidewall of the second semiconductor pattern,
wherein the second electrode extends around at least a part of a substrate-facing surface of the first electrode such that the second electrode at least partially overlaps a portion of the first electrode and the first semiconductor pattern in the vertical direction.

2. The semiconductor light emitting device as claimed in claim 1, further comprising an insulation pattern between the second electrode and sidewalls of the active pattern, the first semiconductor pattern, and the first electrode,
wherein the insulation pattern contacts the second electrode and the sidewalls of the active pattern, the first semiconductor pattern, and the first electrode.

3. The semiconductor light emitting device as claimed in claim 2, wherein the insulation pattern contacts a sidewall of a portion of the second semiconductor pattern that is proximate to the substrate in the vertical direction.

4. The semiconductor light emitting device as claimed in claim 1, wherein:
the second semiconductor pattern includes a first portion distal to the substrate in the vertical direction and a second portion proximate to the substrate in the vertical direction, the first portion having a first width in a horizontal direction substantially parallel to the upper surface of the substrate and the second portion having a second width in the horizontal direction that is less than the first width,
the second electrode contacts a sidewall of the first portion of the second semiconductor pattern, and
the second electrode does not contact a sidewall of the second portion of the second semiconductor pattern.

5. The semiconductor light emitting device as claimed in claim 1, wherein:
the second electrode includes a first portion and a second portion,
the first portion contacts a sidewall of the second semiconductor pattern, and
the second portion extends away from the first portion in a horizontal direction substantially parallel to the upper surface of the substrate.

6. The semiconductor light emitting device as claimed in claim 5, further comprising:
a first contact plug on the substrate, the first contact plug contacting the first electrode; and
a second contact plug on the substrate, the second contact plug contacting the second portion of the second electrode.

7. The semiconductor light emitting device as claimed in claim 6, further comprising:
a conductive division pattern on the second portion of the second electrode, the conductive division pattern being electrically connected to the second portion of the second electrode; and
a photo-conversion pattern on each second semiconductor pattern.

8. The semiconductor light emitting device as claimed in claim 7, wherein:
the at least one light emitting structure includes a plurality of light emitting structures spaced apart from each other in the horizontal direction, and
the second portion of the second electrode electrically connects the first portion of the second electrode that contacts the sidewalls of the second semiconductor patterns.

9. The semiconductor light emitting device as claimed in claim 8, wherein:
the photo-conversion patterns on the second semiconductor patterns of the plurality of light emitting structures are spaced apart from each other by the conductive division pattern, and
each of the photo-conversion patterns independently converts light from the light emitting structure into a red light, a green light, or a blue light.

10. The semiconductor light emitting device as claimed in claim 1, wherein the substrate includes a driver integrated circuit (IC) therein.

11. A semiconductor light emitting device, comprising:
light emitting structures spaced apart from each other on a substrate, each of the light emitting structures including a first semiconductor pattern, an active pattern, and a second semiconductor pattern sequentially stacked in a vertical direction substantially perpendicular to an upper surface of the substrate;
first electrodes contacting a substrate-facing surface of the first semiconductor pattern of each of the light emitting structures; and
second electrodes at least partially surrounding and contacting a sidewall of the second semiconductor pattern of each of the light emitting structures,
wherein the second electrodes extend in a horizontal direction substantially parallel to the upper surface of the substrate to be connected with each other, and
wherein each of the second electrodes extends around at least a part of a substrate-facing surface of a corresponding one of the first electrodes such that each second electrode at least partially overlaps a portion of a corresponding first electrode and a portion of a corresponding first semiconductor pattern in the vertical direction.

12. The semiconductor light emitting device as claimed in claim 11, further comprising an insulation pattern between each of the second electrodes and corresponding sidewalls of the active pattern, the first semiconductor pattern, and the first electrode,
wherein the insulation pattern contacts each of the second electrodes and the sidewalls of the active pattern, the first semiconductor pattern, and the first electrode.

13. The semiconductor light emitting device as claimed in claim 11, wherein:
the second semiconductor pattern of each light emitting structure includes a first portion distal to the substrate in the vertical direction and a second portion proximate to the substrate in the vertical direction, the first portion having a first width in the horizontal direction and the second portion having a second width in the horizontal direction that is less than the first width, and
each of the second electrodes contacts a corresponding sidewall of the first portion of the second semiconductor pattern, and does not contact a corresponding sidewall of the second portion of the second semiconductor pattern.

14. The semiconductor light emitting device as claimed in claim 11, further comprising:
first contact plugs on the substrate, each first contact plug contacting a corresponding one of the first electrodes; and
second contact plugs on the substrate, each second contact plug contacting a corresponding one of the second electrodes.

15. The semiconductor light emitting device as claimed in claim 11, further comprising:

photo-conversion patterns on respective second semiconductor patterns of the light emitting structures; and
a conductive division pattern surrounding the photo-conversion patterns, the conductive division pattern being electrically connected to the second electrodes.

16. A semiconductor light emitting device, comprising:
light emitting structures spaced apart from each other on a drive IC substrate, each of the light emitting structures including a first semiconductor pattern, an active pattern, and a second semiconductor pattern sequentially stacked in a vertical direction substantially perpendicular to an upper surface of the drive IC substrate;
first electrodes respectively a contacting drive IC substrate-facing surface of the first semiconductor pattern of each of the light emitting structures;
second electrodes respectively surrounding and contacting a sidewall of the second semiconductor pattern of each of the light emitting structures;
first contact plugs on the drive IC substrate, each first contact plug contacting a corresponding one of the first electrodes;
second contact plugs on the drive IC substrate, each second contact plug contacting a corresponding one of the second electrodes;
photo-conversion patterns on respective second semiconductor patterns of the light emitting structures; and
a conductive division pattern surrounding the photo-conversion patterns, the conductive division pattern being electrically connected to the second electrodes,
wherein the second electrodes extend in a horizontal direction substantially parallel to the upper surface of the substrate to be connected with each other,
wherein each of the second electrodes extends around at least a part of a contacting drive IC substrate-facing surface of a corresponding one of the first electrodes such that each second electrode at least partially overlaps a portion of a corresponding first electrode and a portion of a corresponding first semiconductor pattern in the vertical direction.

17. The semiconductor light emitting device as claimed in claim 16, further comprising an insulation pattern between each of the second electrodes and corresponding sidewalls of the active pattern, the first semiconductor pattern, and the first electrode,
wherein the insulation pattern contacts each of the second electrodes and the sidewalls of the active pattern, the first semiconductor pattern, and the first electrode.

* * * * *